US008573988B2

(12) United States Patent
Fujikawa

(10) Patent No.: US 8,573,988 B2
(45) Date of Patent: Nov. 5, 2013

(54) MOUNTING STRUCTURE OF CONNECTOR FOR CIRCUIT BOARD

(75) Inventor: Ryo Fujikawa, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 34 days.

(21) Appl. No.: 13/498,945

(22) PCT Filed: Sep. 28, 2010

(86) PCT No.: PCT/JP2010/066870
§ 371 (c)(1),
(2), (4) Date: Mar. 29, 2012

(87) PCT Pub. No.: WO2011/040419
PCT Pub. Date: Apr. 7, 2011

(65) Prior Publication Data
US 2012/0184117 A1    Jul. 19, 2012

(30) Foreign Application Priority Data
Sep. 29, 2009   (JP) .................................. 2009-224308

(51) Int. Cl.
*H01R 12/00*  (2006.01)
(52) U.S. Cl.
USPC .......................................................... 439/79
(58) Field of Classification Search
USPC .......................................................... 439/79
See application file for complete search history.

(56) References Cited

U.S. PATENT DOCUMENTS 3,112,145 A * 11/1963 Swengel ........................ 439/55
4,695,112 A *  9/1987 Maston et al. ................ 439/350
4,708,415 A * 11/1987 White ........................... 439/633
5,035,641 A *  7/1991 Van-Santbrink et al. ..... 439/329
5,319,523 A *  6/1994 Ganthier et al. .............. 361/753
5,702,271 A * 12/1997 Steinman ...................... 439/676
5,971,777 A * 10/1999 Garside ......................... 439/131

(Continued)

FOREIGN PATENT DOCUMENTS

JP    3-4465 A    1/1991
JP    7-8979 U    2/1995

(Continued)

OTHER PUBLICATIONS

Extended European Search Report, dated Apr. 25, 2013, issued by the European Patent Office in counterpart European Application No. 10820534.5.

(Continued)

*Primary Examiner* — Ross Gushi
(74) *Attorney, Agent, or Firm* — Sughrue Mion, PLLC

(57) ABSTRACT

A mounting structure of a connector for a circuit board is provided. A circuit board is formed with a cutout, the cutout has a rectangular shape which is defined by three rectilinear side edges and one side edge is open, and one of the three side edge is a terminal arranging side edge part. Terminals are provided in the terminal arranging side edge part and are arranged along a longitudinal direction of the terminal arranging side edge part. A connector housing is formed with terminal containing grooves on a lower face thereof. The terminals are respectively contained in the terminal containing grooves when the connector housing is fitted into the cutout. By fitting the connector housing into the cutout, the terminals are contained in the terminal containing grooves, thereby to construct the connector for the circuit board in which the terminals are used as connector terminals.

4 Claims, 5 Drawing Sheets

(56) References Cited

U.S. PATENT DOCUMENTS

| | | | |
|---|---|---|---|
| 5,989,040 A * | 11/1999 | Nishimatsu | 439/79 |
| 6,123,550 A * | 9/2000 | Burkert et al. | 439/63 |
| 6,129,562 A * | 10/2000 | Hong | 439/79 |
| 6,171,148 B1 * | 1/2001 | Chiu et al. | 439/607.01 |
| 6,198,632 B1 * | 3/2001 | Goff | 361/752 |
| 6,325,674 B1 * | 12/2001 | Oliphant et al. | 439/676 |
| 6,398,587 B1 * | 6/2002 | Chen et al. | 439/607.35 |
| 6,416,358 B1 * | 7/2002 | Kamarauskas et al. | 439/607.38 |
| 6,482,019 B1 * | 11/2002 | Lo Forte et al. | 439/131 |
| 6,488,543 B2 * | 12/2002 | Oliphant et al. | 439/676 |
| 6,736,651 B2 * | 5/2004 | Ho | 439/79 |
| 6,752,662 B2 * | 6/2004 | Okamoto | 439/607.04 |
| 6,764,344 B2 * | 7/2004 | Maiers | 439/629 |
| 6,793,531 B1 * | 9/2004 | Zhang | 439/607.04 |
| 6,827,610 B2 * | 12/2004 | Lin | 439/607.37 |
| 7,182,610 B2 * | 2/2007 | Lin | 439/79 |
| 7,217,159 B2 * | 5/2007 | Chung | 439/607.01 |
| 7,473,143 B2 * | 1/2009 | Chen | 439/670 |
| 7,497,732 B2 * | 3/2009 | Yi | 439/607.23 |
| 7,500,876 B2 * | 3/2009 | Chang | 439/607.05 |
| 7,572,130 B1 * | 8/2009 | Zhang | 439/79 |
| 7,660,131 B2 * | 2/2010 | Drouillard et al. | 361/784 |
| 7,670,150 B2 * | 3/2010 | Hisamatsu et al. | 439/79 |
| 7,753,737 B2 * | 7/2010 | Yang et al. | 439/660 |
| 7,866,989 B1 * | 1/2011 | Zhu | 439/79 |
| 7,883,369 B1 * | 2/2011 | Sun et al. | 439/607.35 |
| 7,955,112 B2 * | 6/2011 | Yang et al. | 439/328 |
| 7,997,932 B2 * | 8/2011 | Xu | 439/607.04 |
| 8,007,290 B1 * | 8/2011 | Wolff et al. | 439/79 |
| 8,070,526 B2 * | 12/2011 | Zhu | 439/660 |
| 8,096,815 B2 * | 1/2012 | Zhu | 439/83 |
| 8,142,225 B2 * | 3/2012 | Yu | 439/607.35 |
| 8,157,585 B2 * | 4/2012 | Zhu | 439/571 |
| 8,272,897 B1 * | 9/2012 | Lin | 439/607.4 |
| 8,282,403 B2 * | 10/2012 | Sawai | 439/79 |
| 8,337,248 B1 * | 12/2012 | Lan et al. | 439/607.35 |
| 8,342,886 B2 * | 1/2013 | Zhang et al. | 439/660 |
| 8,353,726 B2 * | 1/2013 | Zhang et al. | 439/629 |
| 8,465,299 B2 * | 6/2013 | Ho | 439/79 |
| 2002/0002012 A1 | 1/2002 | Torii | |
| 2003/0003809 A1 * | 1/2003 | Maiers | 439/629 |
| 2003/0171014 A1 * | 9/2003 | Lin | 439/79 |
| 2003/0207600 A1 * | 11/2003 | Ho | 439/79 |
| 2004/0157491 A1 * | 8/2004 | Lin | 439/607 |
| 2004/0180577 A1 * | 9/2004 | Zhang | 439/607 |
| 2004/0242069 A1 * | 12/2004 | Yang | 439/607 |
| 2005/0233602 A1 * | 10/2005 | Link | 439/59 |
| 2006/0234530 A1 * | 10/2006 | Chung | 439/79 |
| 2007/0117459 A1 * | 5/2007 | Chen | 439/607 |
| 2008/0057795 A1 * | 3/2008 | Chen | 439/723 |
| 2009/0011623 A1 * | 1/2009 | Hisamatsu et al. | 439/79 |
| 2009/0029567 A1 * | 1/2009 | Yi | 439/66 |
| 2009/0142944 A1 * | 6/2009 | Zhu | 439/79 |
| 2010/0009555 A1 * | 1/2010 | Zhu | 439/65 |
| 2010/0015836 A1 * | 1/2010 | Zhu | 439/329 |
| 2011/0195605 A1 * | 8/2011 | Zhang et al. | 439/638 |
| 2012/0009806 A1 | 1/2012 | Sawai | |
| 2012/0108109 A1 * | 5/2012 | Zhang et al. | 439/629 |

FOREIGN PATENT DOCUMENTS

| | | |
|---|---|---|
| JP | 10-50425 A | 2/1998 |
| JP | 2000-182694 A | 6/2000 |
| WO | 2010126159 A1 | 11/2010 |

OTHER PUBLICATIONS

Written Opinion (PCT/ISA/237) of the International Searching Authority, issued in corresponding International Application No. PCT/JP2010/066870 on Nov. 9, 2010.

International Search Report (PCT/ISA/210) issued by the International Searching Authority in corresponding International Application No. PCT/JP2010/066870 on Nov. 9, 2010.

* cited by examiner

MOUNTING STRUCTURE OF CONNECTOR FOR CIRCUIT BOARD

TECHNICAL FIELD

The present invention relates to a mounting structure of a connector for a circuit board in which the connector is mounted on the circuit board.

BACKGROUND ART

FIG. 5 is a view for explaining a conventional mounting structure of a connector for a circuit board which is disclosed, for example, in PTL1, and a perspective view showing the same in a state before the connector is mounted.

In this mounting structure as shown in FIG. 5, when a connector 120 is mounted on a circuit board 110, sliding contact portions 122 are formed at respective ends of connector terminals which have been contained beforehand in a connector housing 121, and mounting parts 125 which are formed in a lower part of the connector housing 121 are fitted over a side edge of the circuit board 110, by sliding the connector housing 121 in a direction parallel to the circuit board 110, as shown by an arrow mark C. In this manner, the connector housing 121 is mounted on the circuit board 110, and at the same time, the sliding contact portions 122 of the respective connector terminals are allowed to slide with respect to circuit conductors 112 on the circuit board 110, thereby enabling the connector terminals to be electrically connected to the circuit conductors 112 on the circuit board 110.

CITATION LIST

Patent Literature

[PTL1] Japanese Patent Publication Number 2000-182694

SUMMARY OF INVENTION

Technical Problem

By the way, in the mounting structure of the connector for the circuit board as shown in FIG. 5, the connector housing 121 must be mounted on the circuit board 110 from a side, and there has been a problem of bad mounting workability, because a mounting direction is limited. Moreover, the sliding contact portions 122 of the connector terminals which have been contained beforehand in the connector housing 121 must be slid with respect to the circuit conductors 112 on the circuit board 110. Therefore, there has been such an anxiety that scratches or burrs may occur on the circuit conductors 112.

In view of the above described circumstances, it is an object of the invention to provide a mounting structure of a connector for a circuit board in which a connector housing can be assembled to the circuit board from an easily mountable direction, and there is no anxiety of making any scratches or burrs on conductors at the circuit board side.

Solution to Problem (1) In order to solve the above described problems, there is provided a mounting structure of a connector for a circuit board, comprising:

a circuit board formed with a cutout in a side edge part of the circuit board, wherein the cutout has a rectangular shape which is defined by three rectilinear side edges and one side edge is open outward, and one of the three side edges of the cutout in the rectangular shape at a center which is directed outward is used as a terminal arranging side edge part;

a number of terminals, provided in the terminal arranging side edge part so as to be projected outward from the terminal arranging side edge part in parallel each other and arranged along a longitudinal direction of the terminal arranging side edge part; and a connector housing, having such a size as being fitted into the cutout in the rectangular shape in the circuit board, and formed with terminal containing grooves on a lower face thereof, the terminals being respectively contained in the terminal containing grooves when the connector housing is fitted into the cutout from upper side or lower side, wherein by fitting the connector housing into the cutout, the terminals are contained in the terminal containing grooves, thereby to construct the connector for the circuit board in which the terminals are used as connector terminals.

(2) In the mounting structure of the connector for the circuit board according to the invention, it is preferable that the connector housing is provided with a terminal supporting wall which is substantially vertical with respect to the circuit board, as a back wall of a hood part to be engaged with a mating connector, the terminal containing grooves are formed in a lower part of the terminal supporting wall, other connecting terminals than the terminals are passed through and held in the terminal supporting wall at an upper part than the lower part, back end portions of the connecting terminals which are projected backward from the terminal supporting wall are connected to circuit conductors on the circuit board, and front end portions of the connecting terminals which are projected from the terminal supporting wall into the hood part are used as the other connector terminals of the connector for the circuit board.

(3) In the mounting structure of the connector for the circuit board according to the invention, it is preferable that two side edges opposed to each other among the three rectilinear side edges of the cutout in the rectangular shape, are used as connector housing supporting side edge parts, the connector housing is provided with mounting parts on both outside parts thereof, the mounting parts being configured to be placed on the connector housing supporting side edge parts, and the mounting parts of the connector housing are placed on the connector housing supporting side edge parts, by fitting the connector housing into the cutout.

(4) In the mounting structure of the connector for the circuit board according to the invention, it is preferable that the mounting parts of the connector housing are provided with conductors for constituting a part of a circuit of the connector for the circuit board, and the conductors are connected to circuit conductors which are formed on the connector housing supporting side edge parts.

Advantageous Effects of Invention

According to the mounting structure as described above in (1), it is possible to easily construct the connector for the circuit board in which the terminals provided at the circuit board side are used as the connector terminals, by fitting the connector housing into the cutout which is formed in the side edge part of the circuit board from the above or the side. In this manner, the connector housing can be mounted on the circuit board from the above and the side, and therefore, good mounting workability cab be obtained. Moreover, because the terminals provided on the circuit board are directly contained in the terminal containing grooves of the connector housing, such anxiety that scratches or burrs may occur on the conductors at the circuit board side can be eliminated.

According to the mounting structure as described above in (2), the connecting terminals to be connected to the circuit conductors which are provided on the circuit board are equipped on the same connector housing, and therefore, it is possible to easily construct the connector for the circuit board having various kinds of connector terminals.

According to the mounting structure as described above in (3), mounting stability of the connector housing with respect to the circuit board and mounting strength can be enhanced.

According to the mounting structure as described above in (4), electrical connection between the circuit at the connector side and the circuit at the circuit board side can be performed outside of the connector housing. Therefore, this mounting structure can be effectively utilized for forming an earthing circuit.

DESCRIPTION OF EMBODIMENTS

Figure 1:
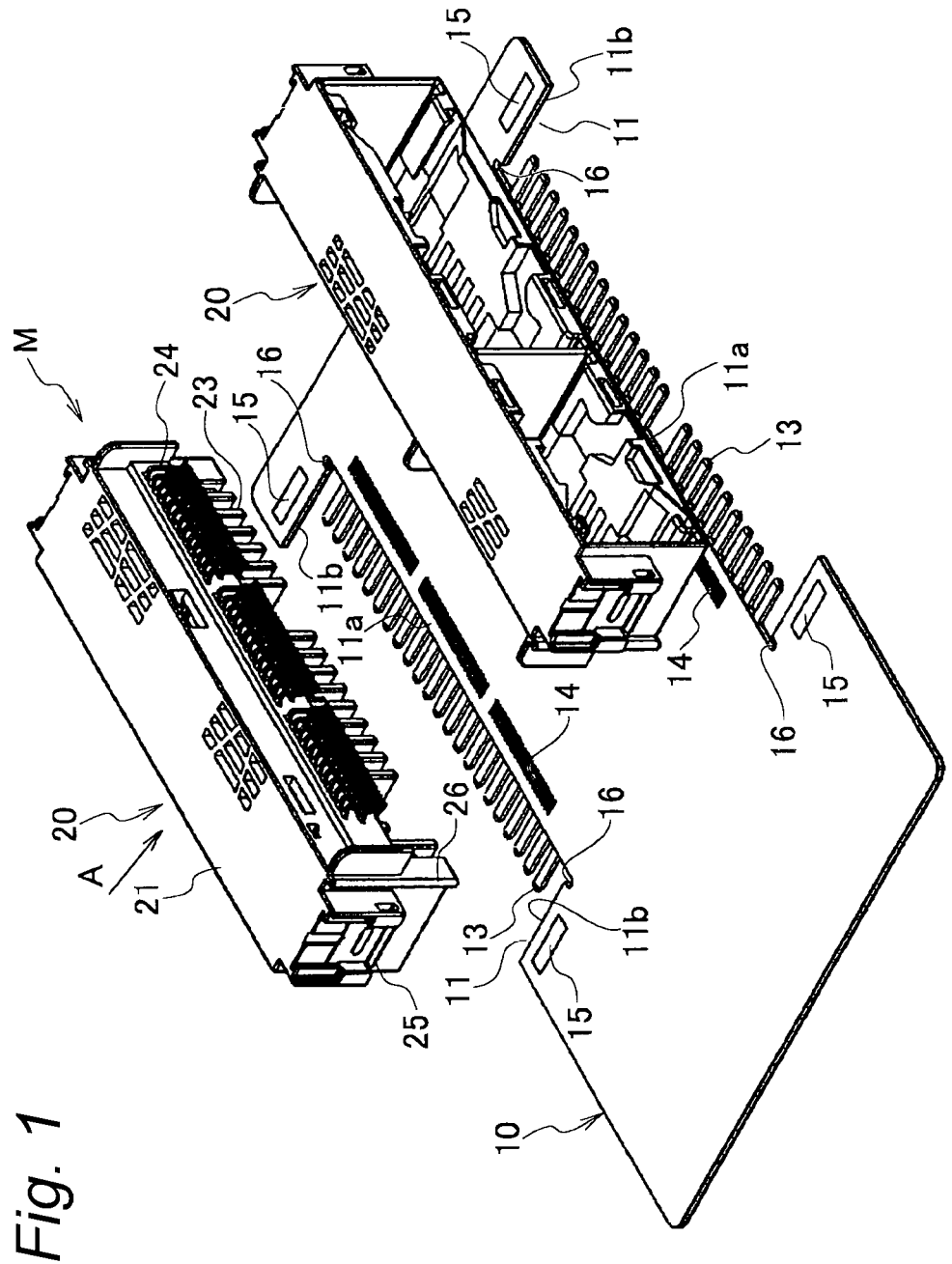
FIG. 1 is a perspective view for explaining a mounting structure of a connector for a circuit board in an embodiment according to the invention, showing a state before the connector is mounted.

Now, an embodiment of the invention will be described referring to the drawings.

Figure 2:
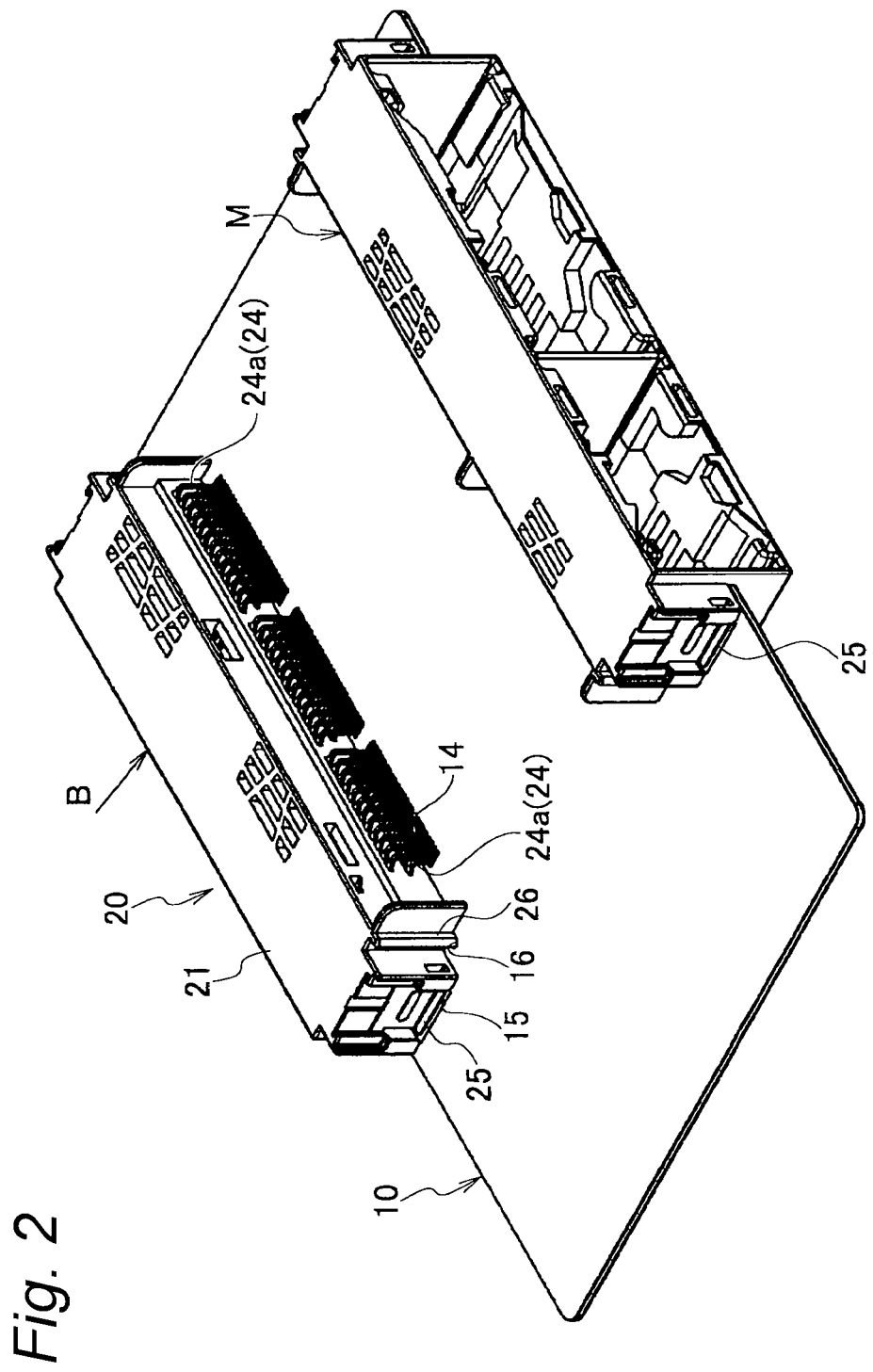
FIG. 2 is a perspective view of the mounting structure showing a state after the connector has been mounted.
Figure 3:
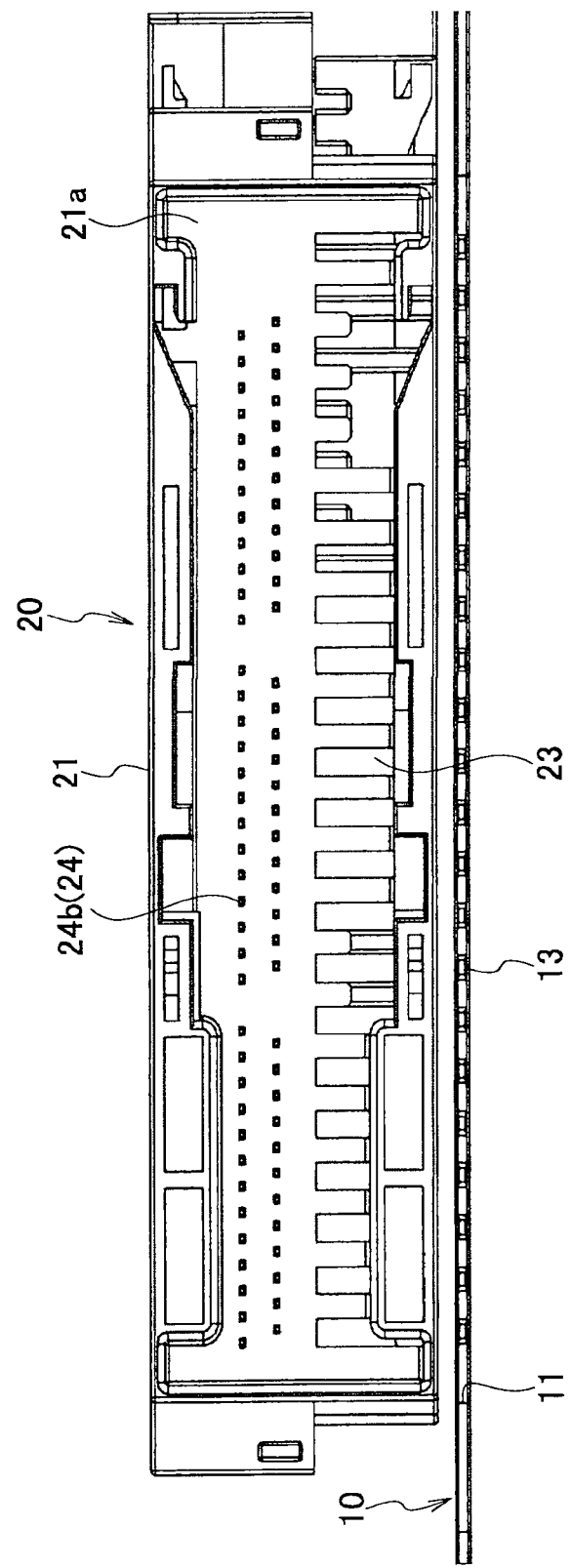
FIG. 3 is a view as seen from a direction of an arrow mark A in FIG. 1.
Figure 4:
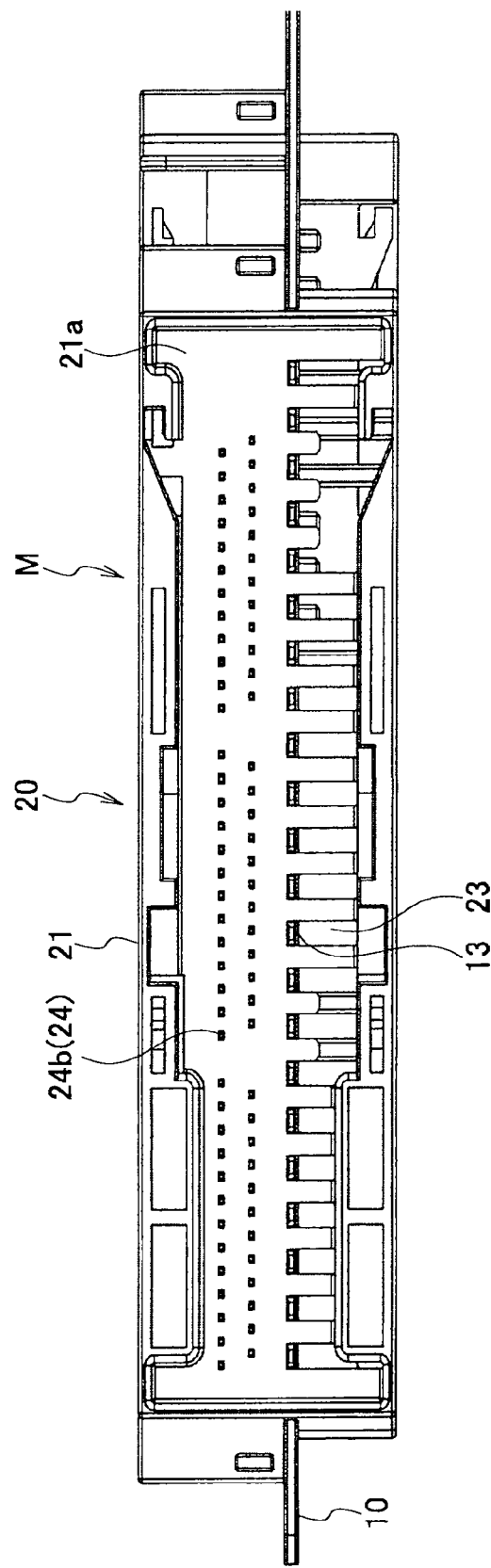
FIG. 4 is a view as seen from a direction of an arrow mark B in FIG. 2.
Figure 5:
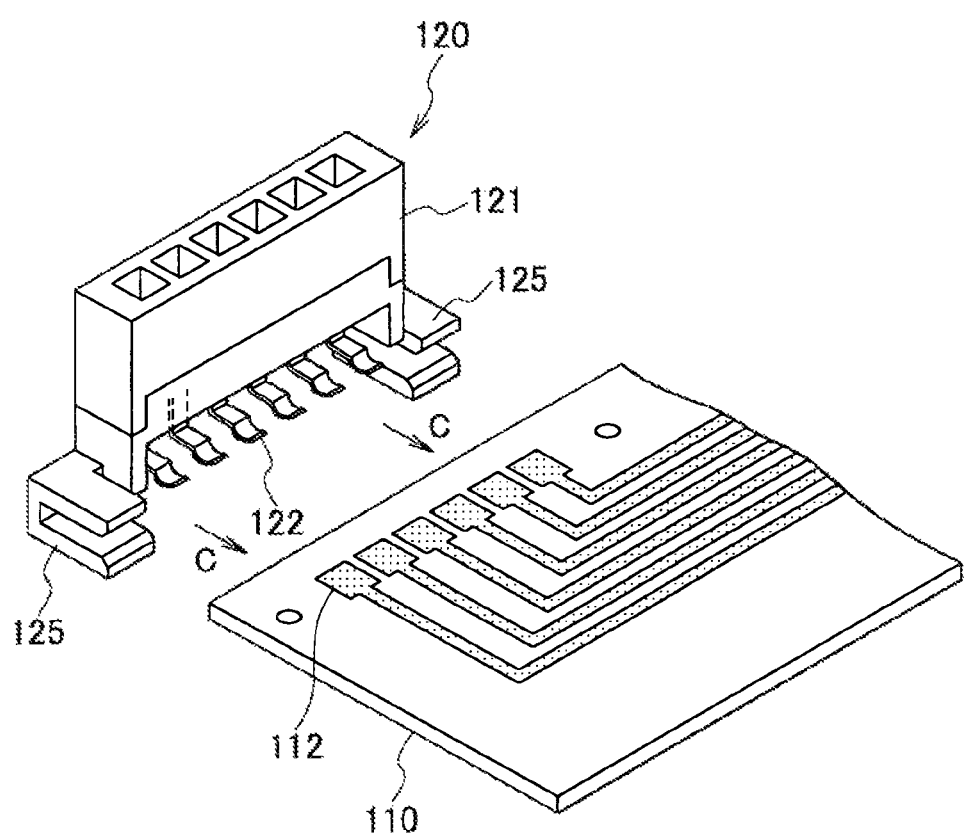
FIG. 5 is a view for explaining a conventional mounting structure of a connector for a circuit board, and a perspective view of the same showing a state before the connector is mounted.

FIG. 1 is a perspective view for explaining a mounting structure of a connector for a circuit board in an embodiment according to the invention, showing a state before the connector is mounted, FIG. 2 is a perspective view showing a state after the connector has been mounted, FIG. 3 is a view as seen from a direction of an arrow mark A in FIG. 1, and FIG. 4 is a view as seen from a direction of an arrow mark B in FIG. 2.

In this mounting structure, as shown in FIG. 1, a cutout 11 in a rectangular shape which is defined by three rectilinear side edges, while the remaining one side edge is open outward, is formed in each of both side edge parts of a circuit board 10. Out of the three rectilinear side edges defining the cutout 11 in a rectangular shape, the side edge at a center which is straightly directed outward is used as a terminal arranging side edge part 11a, and the remaining side edges opposed to each other are used as connector housing supporting side edge parts 11b. The terminal arranging side edge part 11a is provided with a number of terminals 13 which are projected outward from the terminal arranging side edge part 11a in parallel with each other, and arranged in a longitudinal direction of the terminal arranging side edge part 11a. Moreover, circuit conductors 14 are disposed on the circuit board 10 behind the terminal arranging side edge part 11a.

On the other hand, a connector housing 20 having such a size as being fitted into the cutout 11 in a rectangular shape of the circuit board 10 is provided, in both outside parts thereof, with mounting parts 25 to be placed on the connector housing supporting side edge parts 11b. The connector housing 20 is further provided, on its lower face, with terminal containing grooves 23 in which the terminals 13 are respectively contained, when the connector housing 20 is fitted into the cutout 11 from the above or the side of the cutout 11.

Moreover, as shown in FIG. 3, a terminal supporting wall 21a which is substantially vertical with respect to the circuit board 10 is provided on the connector housing 20, as a back wall of a hood part 21 to be engaged with a mating connector. The terminal containing grooves 23 are formed in a lower part of the terminal supporting wall 21a, and a plurality of connecting terminals 24 are passed through and held in an upper part of the terminal supporting wall 21a.

The mounting parts 25 disposed in the outside parts of the connector housing 20 are formed of metal plates (conductors) which constitute a part of a circuit of a connector M for a circuit board. The mounting parts (metal plates) 25 are placed on circuit conductors 15 which are formed on the connector housing supporting side edge parts 11b, and in this state, connected to the circuit conductors 15 by soldering.

Further, positioning projecting pieces 26 are formed on an outer face of the connector housing 20, and engaging grooves 16 with which the positioning projecting pieces 26 are slidably engaged, when the connector housing 20 is mounted on the circuit board 10 from the above, are formed in corner parts where the terminal arranging side edge part 11a intersects with the connector housing supporting side edge parts 11b.

In order to assemble this mounting structure of the connector for the circuit board, the connector housing 20 is fitted into the cutouts 11 of the circuit board 10 from the above thereby to place the mounting parts (metal plates) 25 of the connector housing 20 on the connector housing supporting side edge parts 11b of the circuit board 10. Then, the terminals 13 which are arranged in the terminal arranging side edge part 11a are respectively contained in the terminal containing grooves 23 of the connector housing 20. Thereafter, back end portions 24a of the connecting terminals 24 which are projected backward from the terminal supporting wall 21a of the connector housing 20 are brought into contact with the circuit conductors 14 on the circuit board 10.

In this state, the mounting parts (metal plates) 25 of the connector housing 20 are connected by soldering to the circuit conductors 15 on the connector housing supporting side edge portions 11b of the circuit board 10, and at the same time, the back end parts 24a of the connecting terminals 24 are connected by soldering to the circuit conductors 14 on the circuit board 10.

In this manner, as shown in FIGS. 2 and 4, the mounting structure of the connector M for the circuit board in which the terminals 13 at the side of the circuit board 10 are used as the connector terminals on a lower stage, while front end portions 24b of the connecting terminals 24 which are projected from the terminal supporting wall 21a into the hood part 21 are used as the connector terminals on an upper stage can be completed.

In case where the positioning projecting pieces 26 are not provided on the connector housing 20, it is also possible to fit the connector housing 20 into the cutout 11 of the circuit board 10 from the side (a front side of the cutout 11). However, in this case, attention must be paid so that the circuit conductors 14 may not be rubbed with the back end portions 24a of the connecting terminals 24.

As described above, according to the mounting structure in this embodiment, it is possible to easily construct the connector M for the circuit board in which the terminals 13 provided at the side of the circuit board 10 are used as the connector terminals, by fitting the connector housing 20 into the cutout 11 formed in the side edge part of the circuit board 10 from the above or the side. Because the connector housing 20 can be mounted on the circuit board 10 from the above in this manner, good mounting workability can be obtained. Moreover, because the terminals 13 provided on the circuit board 10 are directly contained in the terminal containing grooves 23 of the connector housing 20 to be used as the connector terminals, such anxiety that scratches or burrs may occur on the conductors at the side of the circuit board 10 can be eliminated.

Moreover, because the connecting terminals 24 to be connected to the circuit conductors 14 which are provided on the circuit board 10 are equipped in the same connector housing 20, it is possible to easily construct the connector M for the circuit board having various kinds of connector terminals.

Moreover, the mounting parts 25 which are provided in the outside parts of the connector housing 20 are placed on the connector housing supporting side edge parts 11b, and therefore, mounting stability of the connector housing 20 with respect to the circuit board 10 and mounting strength can be enhanced.

Additionally, the mounting parts 25 are formed of metal plates, and connected by soldering to the circuit conductors 15 on the connector housing supporting side edge parts 11b. Therefore, connection between the circuit at the connector side and the circuit at the side of the circuit board 10 can be performed outside of the connector housing 20, and this mounting structure can be effectively utilized for forming an earthing circuit, for example.

Further, because the positioning projecting pieces 26 and the engaging grooves 16 are respectively provided on the connector housing 20 and the circuit board 10, it is possible to easily perform positioning work, on occasion of mounting the connector housing 20 from the above, and mounting workability can be enhanced.

This application is based on Japanese Patent Application No. 2009-224308 filed on Sep. 29, 2009, the contents of which are hereby incorporated by way of reference.

REFERENCE SIGNS LIST

M Connector for a circuit board
10 Circuit board
11 Cutout in a rectangular shape
11a Terminal arranging side edge part
11b Connector housing supporting side edge part
13 Terminal
14 Circuit conductor
15 Circuit conductor
16 Engaging groove
20 Connector housing
21 Hood part
21a Terminal supporting wall
23 Terminal containing groove
24 Connecting terminal
24a Back end portion
24b Front end portion
25 Mounting part (conductor)
26 Positioning projecting piece

The invention claimed is:

1. A mounting structure of a connector for a circuit board, comprising:
a circuit board formed with a cutout in a side edge part of the circuit board, wherein the cutout has a rectangular shape which is defined by three rectilinear side edges and one side edge is open outward, and one of the three side edges of the cutout in the rectangular shape at a center which is directed outward is used as a terminal arranging side edge part;
a number of terminals, provided in the terminal arranging side edge part so as to be projected outward from the terminal arranging side edge part in parallel each other and arranged along a longitudinal direction of the terminal arranging side edge part; and
a connector housing, having such a size as being fitted into the cutout in the rectangular shape in the circuit board, and formed with terminal containing grooves on a lower face thereof, the terminals being respectively contained in the terminal containing grooves when the connector housing is fitted into the cutout from upper side or lower side,
wherein by fitting the connector housing into the cutout, the terminals are contained in the terminal containing grooves, thereby to construct the connector for the circuit board in which the terminals are used as connector terminals.

2. The mounting structure of a connector for a circuit board as set forth in claim 1, wherein
the connector housing is provided with a terminal supporting wall which is substantially vertical with respect to the circuit board, as a back wall of a hood part to be engaged with a mating connector,
the terminal containing grooves are formed in a lower part of the terminal supporting wall,
other connecting terminals than the terminals are passed through and held in the terminal supporting wall at an upper part than the lower part,
back end portions of the connecting terminals which are projected backward from the terminal supporting wall are connected to circuit conductors on the circuit board, and
front end portions of the connecting terminals which are projected from the terminal supporting wall into the hood part are used as the other connector terminals of the connector for the circuit board.

3. The mounting structure of a connector for a circuit board as set forth in claim 1, wherein
two side edges opposed to each other among the three rectilinear side edges of the cutout in the rectangular shape, are used as connector housing supporting side edge parts,
the connector housing is provided with mounting parts on both outside parts thereof, the mounting parts being configured to be placed on the connector housing supporting side edge parts, and
the mounting parts of the connector housing are placed on the connector housing supporting side edge parts, by fitting the connector housing into the cutout.

4. The mounting structure of a connector for a circuit board as set forth in claim 3, wherein
the mounting parts of the connector housing are provided with conductors for constituting a part of a circuit of the connector for the circuit board, and
the conductors are connected to circuit conductors which are formed on the connector housing supporting side edge parts.

* * * * *